(12) United States Patent
Li (10) Patent No.: US 10,121,802 B2
(45) Date of Patent: Nov. 6, 2018

(54) ARRAY SUBSTRATE AND METHOD FOR MANUFACTURING THE SAME AND DISPLAY DEVICE

(71) Applicant: BOE TECHNOLOGY GROUP CO., LTD., Beijing (CN)

(72) Inventor: Quanhu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 39 days.

(21) Appl. No.: 15/108,186

(22) PCT Filed: Nov. 11, 2015

(86) PCT No.: PCT/CN2015/094249
§ 371 (c)(1),
(2) Date: Jun. 24, 2016

(87) PCT Pub. No.: WO2016/201868
PCT Pub. Date: Dec. 22, 2016

(65) Prior Publication Data
US 2017/0213849 A1    Jul. 27, 2017

(30) Foreign Application Priority Data

Jun. 16, 2015 (CN) .......................... 2015 1 0334949

(51) Int. Cl.
*H01L 27/14* (2006.01)
*H01L 29/04* (2006.01)
(Continued)

(52) U.S. Cl.
CPC ........ *H01L 27/124* (2013.01); *H01L 27/0266* (2013.01); *H01L 27/1288* (2013.01); *H01L 29/66765* (2013.01); *H01L 29/78618* (2013.01)

(58) Field of Classification Search
None
See application file for complete search history.

(56) References Cited

U.S. PATENT DOCUMENTS 9,000,767 B2 * 4/2015 Schmidt ........... G01R 33/34084
324/318
9,000,797 B2 * 4/2015 Wen ........................ H01L 23/58
324/760.01
(Continued)

FOREIGN PATENT DOCUMENTS

| CN | 102540524 A | 7/2012 |
| CN | 103809318 A | 5/2014 |
| CN | 104900589 A | 9/2015 |

OTHER PUBLICATIONS

Written Opinion of the International Searching Authority for International Application No. PCT/CN2015/094249 and International Search Report dated Mar. 21, 2016. Translation provided by Dragon Intellectual Property Law Firm.

*Primary Examiner* — Nishath Yasmeen
(74) *Attorney, Agent, or Firm* — Harness, Dickey & Pierce, P.L.C.

(57) ABSTRACT

The present disclosure provides an array substrate, a method for manufacturing the same and a display device. The array substrate includes a plurality of signal lines and a connection line electrically connected to the plurality of signal lines. During the formation of each insulation layer on the connection line, a via-hole is formed at a position where the connection line is to be interrupted. In addition, the protection layer is provided to cover the portion of the connection line corresponding to the region where the via-hole is located, so as to protect the connection line. Upon the completion of the insulation layers, the connection line may be interrupted through the via-holes, so as to interrupt electrical connection among the signal lines.

9 Claims, 6 Drawing Sheets

(51) Int. Cl.
*H01L 27/12* (2006.01)
*H01L 27/02* (2006.01)
*H01L 29/786* (2006.01)
*H01L 29/66* (2006.01)

(56) References Cited

U.S. PATENT DOCUMENTS

| | | | |
|---|---|---|---|
| 2001/0028415 A1 | 10/2001 | Hirabayashi | |
| 2009/0045733 A1* | 2/2009 | Suh | H01L 27/3276 |
| | | | 313/504 |
| 2012/0168791 A1* | 7/2012 | Zhou | H01L 27/0288 |
| | | | 257/93 |

* cited by examiner

ARRAY SUBSTRATE AND METHOD FOR MANUFACTURING THE SAME AND DISPLAY DEVICE

CROSS-REFERENCE TO RELATED APPLICATIONS

The present application is the U.S. national phase of PCT Application No. PCT/CN2015/094249 filed on Nov. 11, 2015, which claims a priority of the Chinese patent application No. 201510334949.X filed on Jun. 16, 2015, the contents of which are incorporated herein by reference in their entirety.

TECHNICAL FIELD

The present disclosure relates to the field of display technology, in particular to an array substrate and a method for manufacturing the same and a display device.

BACKGROUND

During the manufacture of an array substrate, such a phenomenon as electro-static discharge (ESD) may inevitably occur due to the movement of the array substrate on a machine table as well as the manufacturing process. Due to accumulation of electrostatic electricity, an obvious potential difference may be formed between conductors on the array substrate. A high voltage or current may be generated instantaneously once the ESD occurs, and then the performance of a semiconductor layer or metal wires on the array substrate may be degraded, and even the semiconductor layer or the metal wires may be damaged. As a result, the performance of the array substrate may be degraded and even the array substrate may be damaged too, and the yield thereof may be adversely affected.

In the related art, there are the following electrostatic protection methods for the array substrate.

1. A protection circuit including a thin film transistor (TFT) may be provided. When a large voltage is applied to the TFT, a current outputted by the TFT may increase exponentially, and then an impact current generated by the ESD is discharged through the TFT to a reference level or a large resistance-capacitance network.

2. A plurality of point-discharge points may be provided. After a point discharge pattern is formed, the electrostatic electricity in the proximity of the point discharge pattern may be discharged via the point-discharge points, so as to protect the wires.

However, the above methods have following defects.

1. When the electrostatic protection adopts the protection circuit, the electrostatic protection depends on the formation of the TFT. Generally speaking, the formation of the TFT at least includes depositing two metal layers and dry-etching an insulation layer, and it is impossible to prevent the occurrence of the electrostatic electricity in manufacturing processes before the formation of the TFT. In some manufacturing processes, the protection circuit is formed at the end of the whole manufacturing process, and at this point, the protection circuit does not make much sense in the elimination of the electrostatic electricity generated during the manufacture of the array substrate.

2. When the point-discharge points are adopted, the electrostatic electricity is discharged only when a breakdown field generated by the metallic points is sufficient for the breakdown of the insulation layer. The electrostatic electricity is discharged at a random position and at a random amount, and meanwhile it is very difficult to ensure the electrostatic discharge each time.

SUMMARY

The present disclosure is to provide an array substrate, a method for manufacturing the same and a display device, which can provide electrostatic protection during the manufacture of the array substrate.

In order to solve the above technical problem, the present disclosure provides in some embodiments a method for manufacturing an array substrate, including steps of: forming a plurality of signal lines for transmitting an identical kind of signal; forming a connection line electrically connected to the plurality of signal lines; forming a first insulation layer on the plurality of signal lines and forming a first via-hole in the first insulation layer through a patterning process; forming a protection layer covering a portion of the connection line corresponding to a region where the first via-hole is located; and forming at least one second insulation layer on the first insulation layer, and forming a second via-hole in each second insulation layer at a position corresponding to the first via-hole through a patterning process. After the step of forming the at least one second insulation layer, the method further includes: removing a portion of the protection layer corresponding to the region where the first via-hole is located; and interrupting the connection line at a position corresponding to the first via-hole, so as to interrupt electrical connection among the plurality of signal lines.

Alternatively, before the step of forming the at least one second insulation layer, the method further includes: forming a pattern of a first conductive layer; and the first conductive layer forms the protection layer.

Alternatively, the pattern of the first conductive layer is formed before the formation of each second insulation layer, and at least one of the first conductive layers forms the protection layer.

Alternatively, the array substrate includes at least two kinds of signal lines for transmitting different signals, and connection lines corresponding to the at least two kinds of signal lines, respectively; the connection lines corresponding to the at least two kinds of signal lines are electrically connected to each other.

Alternatively, before the step of removing the portion of the protection layer corresponding to the region where the first via-hole is located, the method further includes: interrupting electrical connection between the connection lines corresponding to the different kinds of signal lines.

Alternatively, after the step of interrupting the connection line at the position corresponding to the first via-hole, the method further includes: forming a third insulation layer at a position where the connection line is interrupted.

Alternatively, the array substrate is a bottom-gate TFT array substrate, the signal lines include a plurality of gate lines and a plurality of data lines, and the connection line includes a first connection line electrically connected to the gate lines and a second connection line electrically connected to the data lines. The method further includes steps of: forming a gate metal layer, and forming the plurality of gate lines and the first connection line electrically connected to the gate lines through a patterning process; forming a gate insulation layer on the plurality of gate lines, and forming the first via-hole and a third via-hole in the gate insulation layer through a patterning process, so as to expose the first connection line at regions where the first via-hole and the third via-hole are located; forming a source-drain metal layer on the gate insulation layer, and forming the plurality of data lines, the second connection line electrically connected to the data lines, and the protection layer through a patterning process, a portion of the first connection line corresponding to the region where the first via-hole is located being covered by the protection layer, the second connection line being electrically connected to the first connection line through the third via-hole; forming a passivation layer on the source-drain metal layer, and forming the second via-hole, a fourth via-hole and a fifth via-hole in the passivation layer through a patterning process, the second via-hole being located at a position corresponding to the first via-hole, the fourth via-hole being located at a position corresponding to the third via-hole; removing a portion of the second connection line corresponding to a region where the fourth via-hole is located through a wet-etching process, so as to interrupt electrical connection between the second connection line and the second connection line; removing the protection layer and a portion of the first connection line corresponding to a region where the first via-hole is located through a wet-etching process, so as to interrupt the first connection line, thereby to interrupt the electrically connection among the gate lines; and removing a portion of the second connection line corresponding to a region where the fifth via-hole is located through a wet-etching process, so as to interrupt the second connection line, thereby to interrupt the electrical connection among the data lines.

Alternatively, the step of forming the plurality of data lines, the second connection line electrically connected to the data lines, and the protection layer through a patterning process includes: applying a photoresist onto the source-drain metal layer, and exposing and developing the photoresist to form a photoresist reserved region at least corresponding to regions where the data lines, the second connection lines and the protection layer are located, and a photoresist unreserved region corresponding to the other regions; etching off the source-drain metal layers at the photoresist unreserved region; and removing the photoresist at the photoresist reserved region, so as to form the data lines, the second connection line and the protection layer.

The present disclosure provides in some embodiments an array substrate manufactured by the above-mentioned method.

Alternatively, the array substrate includes a base substrate, a plurality of gate lines formed on the base substrate, and a first connection line formed on the base substrate. The first connection line is connected to the gate lines and provided with a plurality of via-holes, and the plurality of via-holes are spaced from the gate lines, and the plurality of via-holes and the gate lines are alternately arranged.

Alternatively, the first connection line is perpendicular to the gate lines.

Alternatively, the array substrate further includes a plurality of data lines crossing the gate lines, and a second connection line. The second connection line is connected to the data lines and provided with a plurality of via-holes, and the plurality of via-holes in the second connection line and the data lines are alternately arranged.

Alternatively, the second connection line is perpendicular to the data lines.

Alternatively, the second connection line is perpendicular to the first connection line.

The present disclosure provides in some embodiments a display device including the above-mentioned array substrate.

According to the embodiments of the present disclosure, during the manufacture of the array substrate, the connection line is provided to connect the signal lines, so as to increase a resistance-capacitance value, thereby to improve the absorption capability to the electrostatic electricity. Since it merely needs to provided one layer of connection line to achieve the electrostatic protection, thus the electrostatic protection can be provided for the array substrate in most of the time during the manufacture process. The connection line is covered by at least two insulation layers, and the via-holes for interrupting the connection line are formed in the insulation layers at positions corresponding to each other, so as to prevent the insulation layers from being dry-etched for a long period of time, thereby to remarkably reduce the electrostatic electricity generated during the formation of the via-holes. In addition, the protection layer is provided to cover the portion of the connection line corresponding to the region where the via-hole is located, so as to prevent the connection line from being interrupted during the manufacture of the array substrate. Upon the completion of the insulation layers, the connection line may be interrupted through the via-holes, so as to interrupt the electrical connection among the signal lines.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

The present disclosure provides an array substrate and a method for manufacturing the same, which can provide electrostatic protection during the manufacture of the array substrate.

The array substrate includes a plurality of signal lines for transmitting an identical kind of signal (e.g., gate lines and data lines) and a connection line. The connection line is configured to electrically connect the signal lines, so as to reduce isolated traces, increase a resistance-capacitance value of the traces and then improve the absorption capability to the electrostatic electricity. Since it merely needs to provide one layer of connection line to achieve the electrostatic protection, thus the electrostatic protection can be provided for the array substrate in most of the time during the manufacture process. Upon the completion of the manufacture of the array substrate, the electrical connection among the signal lines may be interrupted, so as to transmit signals normally.

In the method, the electrical connection among the signal lines is interrupted by interrupting the connection line. The connection line is covered by at least two insulation layers, and via-holes are formed in the insulation layers at positions corresponding to each other. Upon the completion of the manufacture of the insulation layers, the connection line may be interrupted through the via-holes, so as to prevent the insulation layers from being dry-etched for a long period of time, thereby to remarkably reduce the electrostatic electricity generated during the formation of the via-holes. A protection layer is provided to cover portions of the connection line corresponding to regions where the via-holes are located, so as to prevent the connection line from being interrupted during the manufacture of the array substrate.

The connection line may be interrupted by a dry-etching or wet-etching process. Optionally, a portion of the connection line exposed by the via-hole may be removed by a wet-etching process, so as to interrupt the connection line.

According to the method of the present disclosure, the connection line connecting the signal lines is provided to form a large resistance-capacitance network, thereby to improve the absorption capability to the electrostatic electricity. Since it merely needs to provide one layer of connection line to achieve the electrostatic protection, thus the electrostatic protection can be provided for the array substrate in most of the time during the manufacture process. During the formation of the insulation layers at the connection line, the via-holes for interrupting the connection line are formed in the insulation layers at positions corresponding to each other, so as to prevent the insulation layers from being dry-etched for a long period of time, thereby to remarkably reduce the electrostatic electricity generated during the formation of the via-holes. In addition, the protection layer is provided to prevent the connection line from being interrupted during the manufacture of the array substrate, so as to provide the electrostatic protection. Upon the completion of the insulation layers, the connection line may be interrupted through the via-holes, so as to interrupt the electrical connection among the signal lines. In most of the time during the manufacture of the array substrate, the signal lines are at an identical potential due to the connection line, so it is able to prevent point discharge of the signal lines. In addition, the signal lines are connected to each other to form a large resistance-capacitance network, so it is able to absorb the electrostatic electricity in a better manner.

For ease of understanding, several manufacturing processes involved in the embodiments of the present disclosure will be described hereinafter.

During the semiconductor manufacture, a selected image, pattern or object needs to be used to shield a layer to be processed, so as to control a region to be etched. This image, pattern or object is called as "mask plate".

Etching refers to a process of removing an undesired portion of the layer, either chemically or physically. An object of the etching process is to provide the layer with a pattern identical to the mask plate. During the etching, a reserved photoresist layer (or a mask layer) may not be obviously etched by an etching source, and it may be used as the mask plate to protect a region of the layer to be reserved. The region of the layer not covered by the photoresist may be selectively etched off.

The etching process for the semiconductor manufacture includes a dry-etching process and a wet-etching process.

For the dry-etching process, plasma generated in a gas may pass through a photoresist window formed by photoetching, and physically and chemically react with the layer, so as to etch off material at an exposed surface of the layer. Through the dry-etching process, it is able to acquire an accurate characteristic pattern, i.e., to control a size of the pattern accurately.

For the wet-etching process, a liquid chemical reagent (e.g., acid, base or solvent) may be used to chemically remove material at a surface of the layer. A window may also be provided by photoetching, so as to etch off material at an exposed surface of the layer, thereby to acquire a characteristic pattern.

The wet-etching process has selectivity and an etching rate larger than those of the dry-etching process. The wet-etching process is mainly used for etching a film made of a metal or a metal oxide, and the dry-etching process is mainly used for etching the photoresist, or a film made of $SiO_x$, $SiN_x$ or $Si(ON)_x$.

As compared with the dry-etching process, the wet-etching process can be implemented more easily. In addition, the electrostatic electricity may be generated more easily during the dry-etching process for a long period of time.

A patterning process for a layer will be described as follows. A photoresist is applied onto the layer, and then exposed and developed with a mask plate, so as to form a photoresist reserved region and a photoresist unreserved region. Then, the layer at the photoresist unreserved region is etched off, and the photoresist at the photoresist reserved region is removed, so as to form the pattern of the layer.

The present disclosure will be described hereinafter in conjunction with the drawings and embodiments. The following embodiments are for illustrative purposes only, but shall not be used to limit the scope of the present disclosure.

Figure 1:
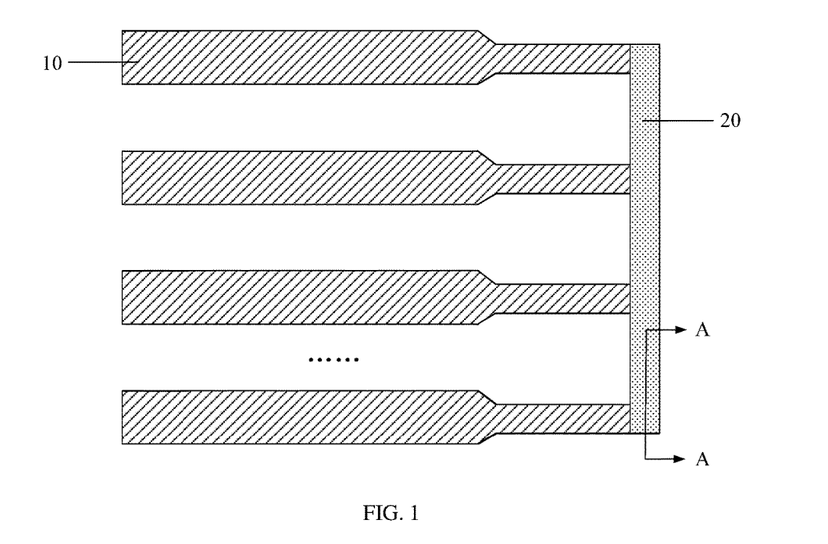
FIG. 1 is a schematic view showing signal lines and a connection line for the signal lines on an array substrate according to one embodiment of the present disclosure.
Figure 2:
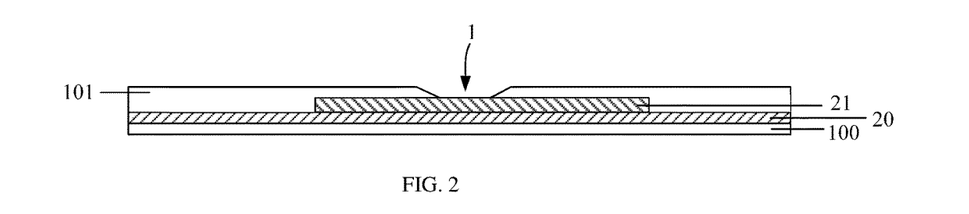
FIGS. 2-4 are schematic views showing a method for manufacturing the array substrate according to one embodiment of the present disclosure.
Figure 3:
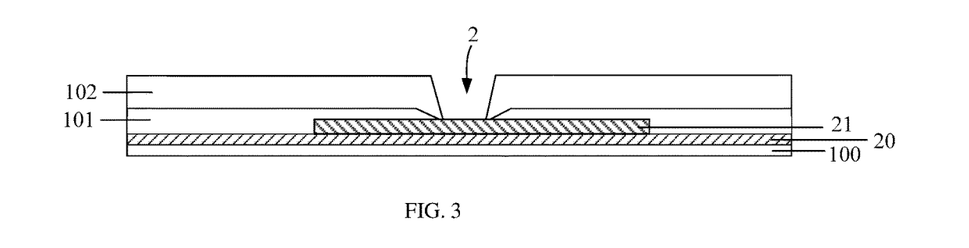

As shown in FIGS. 1-4, the present disclosure provides in some embodiments a method for manufacturing an array substrate, which includes steps of: forming a plurality of signal lines 10 for transmitting an identical kind of signal; forming a connection line 20 electrically connected to the plurality of signal lines 10; forming a first insulation layer 101 on the plurality of signal lines 10 and forming a first via-hole 1 in the first insulation layer 101 through a patterning process, as shown in FIG. 2; forming a protection layer 21 covering a portion of the connection line 20 corresponding to a region where the first via-hole 1 is located; and forming at least one second insulation layer 102 on the first insulation layer 101, and forming a second via-hole 2 in the second insulation layer 102 at a position corresponding to the first via-hole through a patterning process, as shown in FIGS. 2-3.

Figure 4:
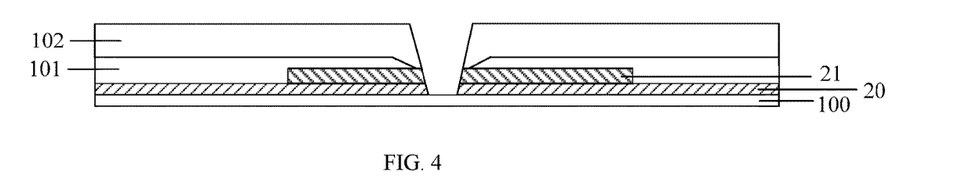

As shown in FIG. 4, subsequent to the step of forming the second insulation layer 102, the method further includes: removing a portion of the protection layer 21 corresponding to the region where the first via-hole 1 is located; and interrupting the connection line 20 at a position corresponding to the first via-hole 1, so as to interrupt the electrical connection among the plurality of signal lines 10.

In the case that the array substrate is a TFT array substrate, the signal lines 10 may be gate lines or data lines.

Figure 6:
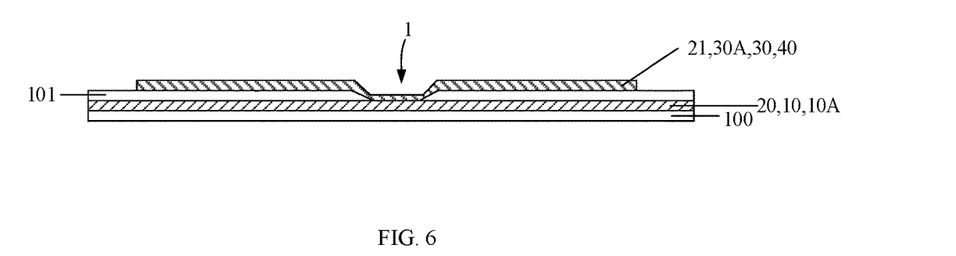
FIGS. 6-8 are schematic views showing the method for manufacturing the array substrate according to one embodiment of the present disclosure.
Figure 7:
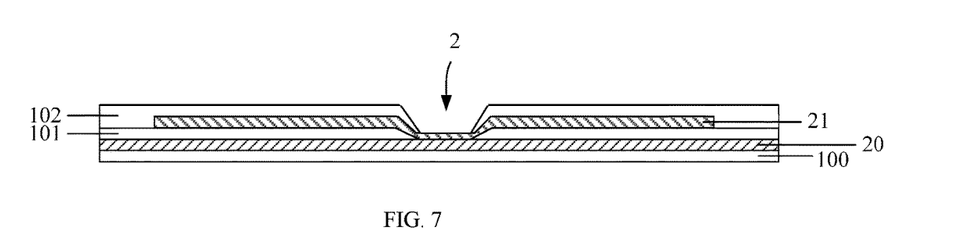
Figure 8:
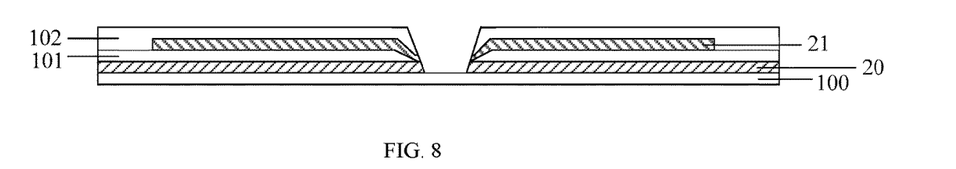

The protection layer 21 may be formed prior to the formation of the first insulation layer 101, as shown in FIG. 2. The protection layer 21 may also be formed subsequent to the formation of the first insulation layer 101 and prior to the formation of the at least one second insulation layer 102, as shown in FIG. 6. FIGS. 6-8 show the manufacture procedure of the protection layer 21.

During the actual manufacture, optionally, the portion of the connection line 20 at a position corresponding to the first via-hole 1 may be removed by a wet-etching process, so as to interrupt the connection line 20.

Figure 14:
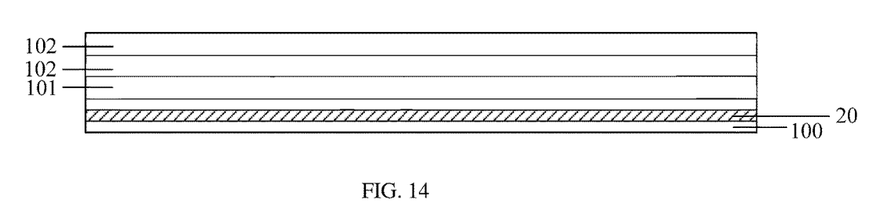
FIGS. 14 and 15 are schematic views showing the method for manufacturing the array substrate according to one embodiment of the present disclosure.
Figure 15:
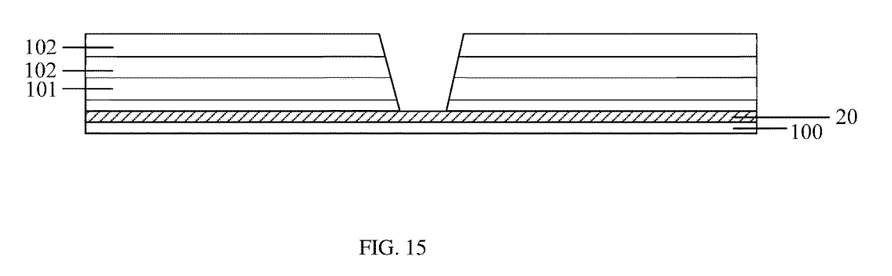

According to the embodiments of the present disclosure, the connection line connected to the signal lines are provided so as to provide a large resistance-capacitance network, thereby to improve the absorption capability to the electrostatic electricity. Since it merely needs to provide one layer of connection line to achieve the electrostatic protection, thus the electrostatic protection can be provided for the array substrate in most of the time during the manufacture process. During the formation of each insulation layer at the connection line, the via-hole is formed by a dry-etching process in the insulation layer at a position corresponding to a portion of the connection line to be interrupted, so as to prevent the insulation layers from being dry-etched for a long period of time (as shown in FIGS. 14 and 15), thereby to remarkably reduce the electrostatic electricity generated during the formation of the via-hole. In addition, it is unnecessary in the embodiments of the present disclosure to etch off several insulation layers through a single dry-etching process.

The protection layer 21 may be made of a conductive material, and it may not be damaged in the case of forming, by the dry-etching process, the via-hole in the insulation layer thereon. At this time, prior to the step of forming the at least one second insulation layer 102, the method further includes: forming a pattern of a first conductive layer. The first conductive layer forms the protection layer 21.

To be specific, the first conductive layer may be formed on the connection line 20 before the formation of the first insulation layer 101, and then the pattern of the first conductive layer may be formed by a patterning process. The first conductive layer is taken as the protection layer 21, so as to cover the portion of the connection line 20 corresponding to the region where the first via-hole 1 is located, as shown in FIG. 2. The first conductive layer 21 is formed by a newly-added film.

During the actual application, the protection layer 21 and a conductive pattern of the array substrate may be formed by an identical film. At this time, the protection layer 21 may be formed after the formation of the first insulation layer 101 and before the formation of the at least one second insulation 102. Taking a bottom-gate TFT array substrate as an example, in the case that the signal lines 10 are gate lines, the first insulation layer 101 is a gate insulation layer, and the protection layer 21 and the source electrode and the drain electrode of the TFT are formed by an identical source-drain metal layer. In this way, it is able to simplify the manufacture process and reduce the production cost.

Of course, the protection layer 21 may also be made of an inorganic insulating material. Optionally, it may be made of a photoresist. At this time, the protection layer 21 may be formed as follows. During the formation of a pattern of the connection line 20, the photoresist corresponding to a portion of the connection line 20 to be interrupted (i.e., corresponding to a region where the first via-hole 1 is located) is not removed, and the reserved photoresist is used to form the protection layer 21. The photoresist may be exposed, then removed by a developing liquid or stripped by a stripping liquid. The developing and stripping processes are each a wet-etching process. Hence, the protection layer 21 formed by the photoresist may not be damaged in the case that the insulation layer is being dry-etched, nor be damaged in the case that the conductive layer is being wet-etched. As a result, during the manufacture of the array substrate, it is able for the protection layer 21 to prevent the connection line 20 from being broken.

Figure 12:
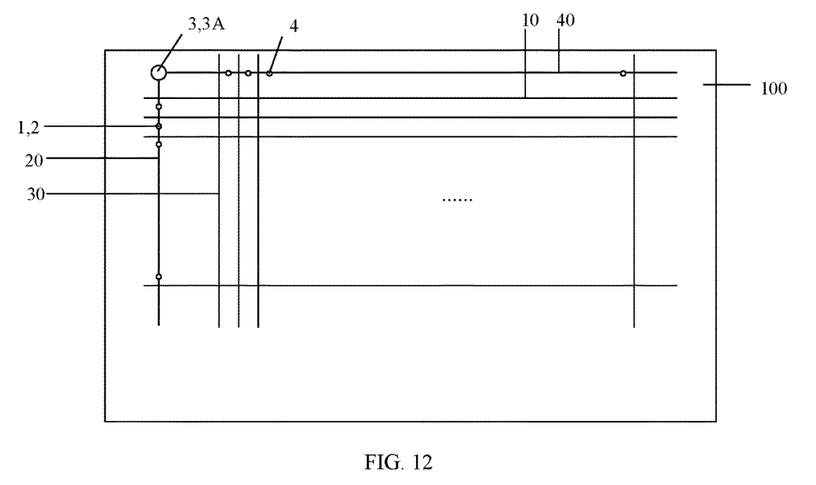
FIGS. 12 and 13 are schematic views showing a sequence for interrupting connection lines of the array substrate according to one embodiment of the present disclosure.

Usually, the array substrate include at least two kinds of signal lines for transmitting different signals, e.g., gate lines 10 and data line 30 (as shown in FIG. 12). At this time, the connection lines of the array substrate include a first connection line 20 electrically connected to the gate lines 10 and a second connection line 40 electrically connected to the data lines 30, as shown in FIG. 12. In the embodiments of the present disclosure, the connection lines corresponding to the at least two kinds of signal lines are electrically connected to each other. To be specific, the first connection line 20 is electrically connected to the second connection line 40, so as to provide a larger resistance-capacitance network, thereby to improve the absorption capability to the electrostatic electricity.

Figure 13:
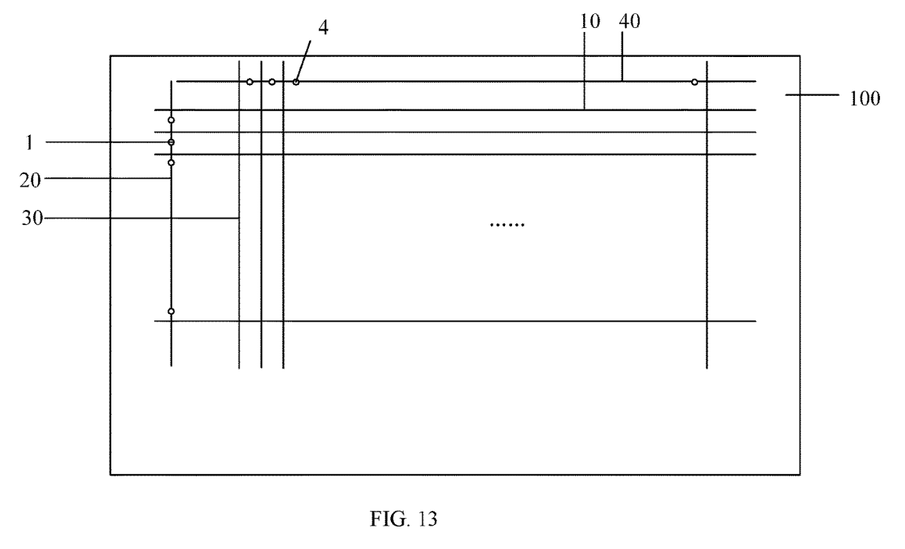

Further, after the formation of the insulation layers, prior to the step of removing the portion of the protection layer 21 corresponding to the region where the first via-hole 1 is located so as to interrupt the connection line at a position corresponding to the first via-hole 1, the method further includes: interrupting the electrical connection between the connection lines corresponding to the different kinds of signal lines, i.e., interrupting the electrical connection between the first connection line 20 and the second connection line 40, as shown in FIG. 13. In other words, the electrical connection among the signal lines is interrupted after the electrical connection between the connection lines is interrupted.

Through the above-mentioned steps, in most of the time during the manufacture of the array substrate, all the signal lines are electrically connected to each other, so as to provide a large resistance-capacitance network, thereby to improve the absorption capability to the electrostatic electricity. Upon the completion of the formation of the insulation layers, the electrical connection between the connection lines corresponding to the different kinds of signal lines is interrupted at first, and at this time, the signal lines of the same kind are still electrically connected to each other, so as to absorb the electrostatic electricity. In order to interrupt the electrical connection among the signal lines of the same kind, it is merely required to interrupt the connection line by the wet-etching process, so as to reduce the electrostatic electricity, thereby to ensure the performance of the array substrate.

Figure 5:
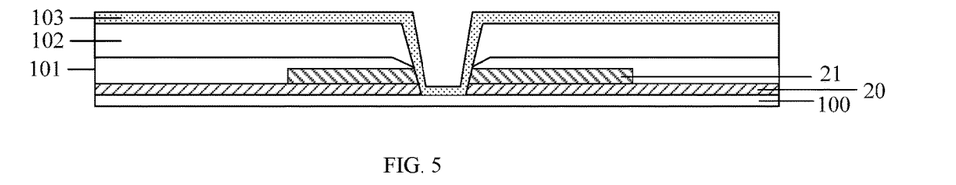
FIG. 5 is a partial cross sectional view of the array substrate taken along a line A-A in FIG. 1.
Figure 9:
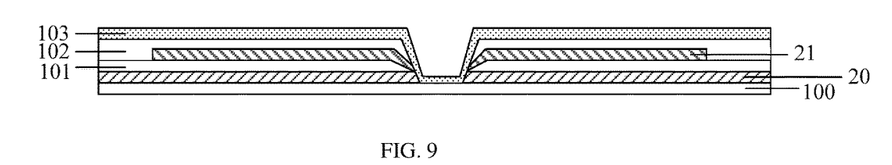
FIG. 9 is another partial cross sectional view of the array substrate taken along a line A-A in FIG. 1.

Subsequent to the step of interrupting the electrical connection among the signal lines, i.e., interrupting the connection line at a position corresponding to the first via-hole, the method further includes forming a third insulation layer 103 at a position where the connection line is interrupted, as shown in FIGS. 5 and 9.

In the case that the array substrate include one second insulation layer 102, as shown in FIGS. 1 and 6-9, the method includes steps of: forming a plurality of signal lines 10 for transmitting an identical kind of signal; forming the connection line 20 electrically connected to the signal lines 10; forming the first insulation layer 101 on the signal lines 10, and forming the first via-hole 1 in the first insulation layer 101 through a patterning process; forming the protection layer 21 on the first insulation layer 101 to cover a portion of the connection line 20 corresponding to a region where the first via-hole 1 is located; forming the second insulation layer 102 on the protection layer 21, and forming the second via-hole 2 in the second insulation layer 102 at a position corresponding to the first via-hole 1 through a patterning process; removing a portion of the protection layer 21 corresponding to a region where the first via-hole 1 is located; removing a portion of the connection line 20 at a position corresponding to the first via-hole 1 through a wet-etching process, so as to interrupt the connection line 20, thereby to interrupt the electrical connection among the signal lines 10; and forming the third insulation layer 103 at a position where the connection line 20 is interrupted.

Figure 10:
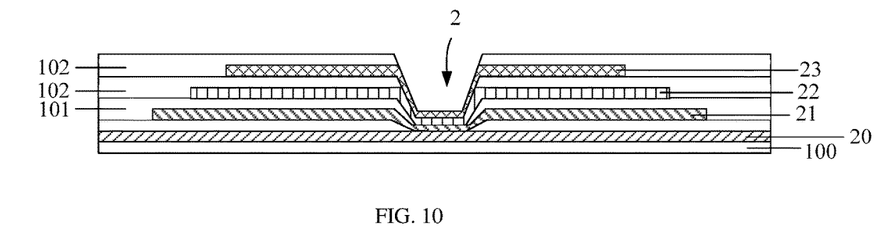
FIGS. 10 and 11 are schematic views showing the method for manufacturing the array substrate according to one embodiment of the present disclosure.
Figure 11:
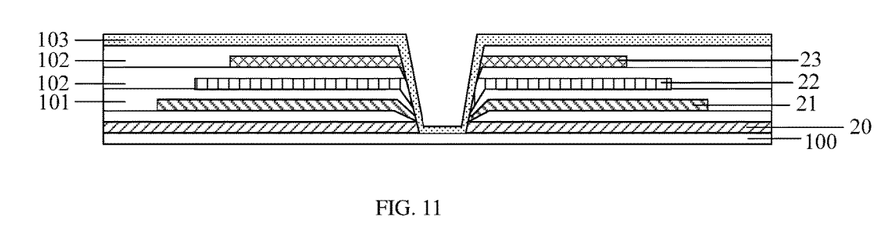

In the case that the array substrate includes at least two second insulation layers 102, as shown in FIGS. 10 and 11, the pattern of the conductive layer arranged between the two insulation layers may include a first pattern (e.g., 22 and 23). The first pattern is superposed onto the protection layer 21 through the second via-holes 2 in the second insulation layers 102, so as to prevent the connection line 20 from being damaged by an etchant used for forming the pattern of the conductive layer. Upon the completion of the formation of the second insulation layers 102, the connection line 2 may be interrupted merely by removing a portion of the connection line 20 and the first pattern at a position corresponding to the second via-hole 2 through a wet-etching process. As compared to the etching of a plurality of insulation layers through a single dry-etching process, the etching of a plurality of conductive layers through a single wet-etching process may be implemented more easily. In addition, as compared with the dry-etching process for a long period of time, the electrostatic electricity is less likely to be generated in the wet-etching process.

The present disclosure will be described hereinafter by taking a bottom-gate TFT array substrate as an example.

As shown in FIGS. 1, 6-9 and 12-13, the method for manufacturing the bottom-gate TFT array substrate may include the following steps.

Figure 16:
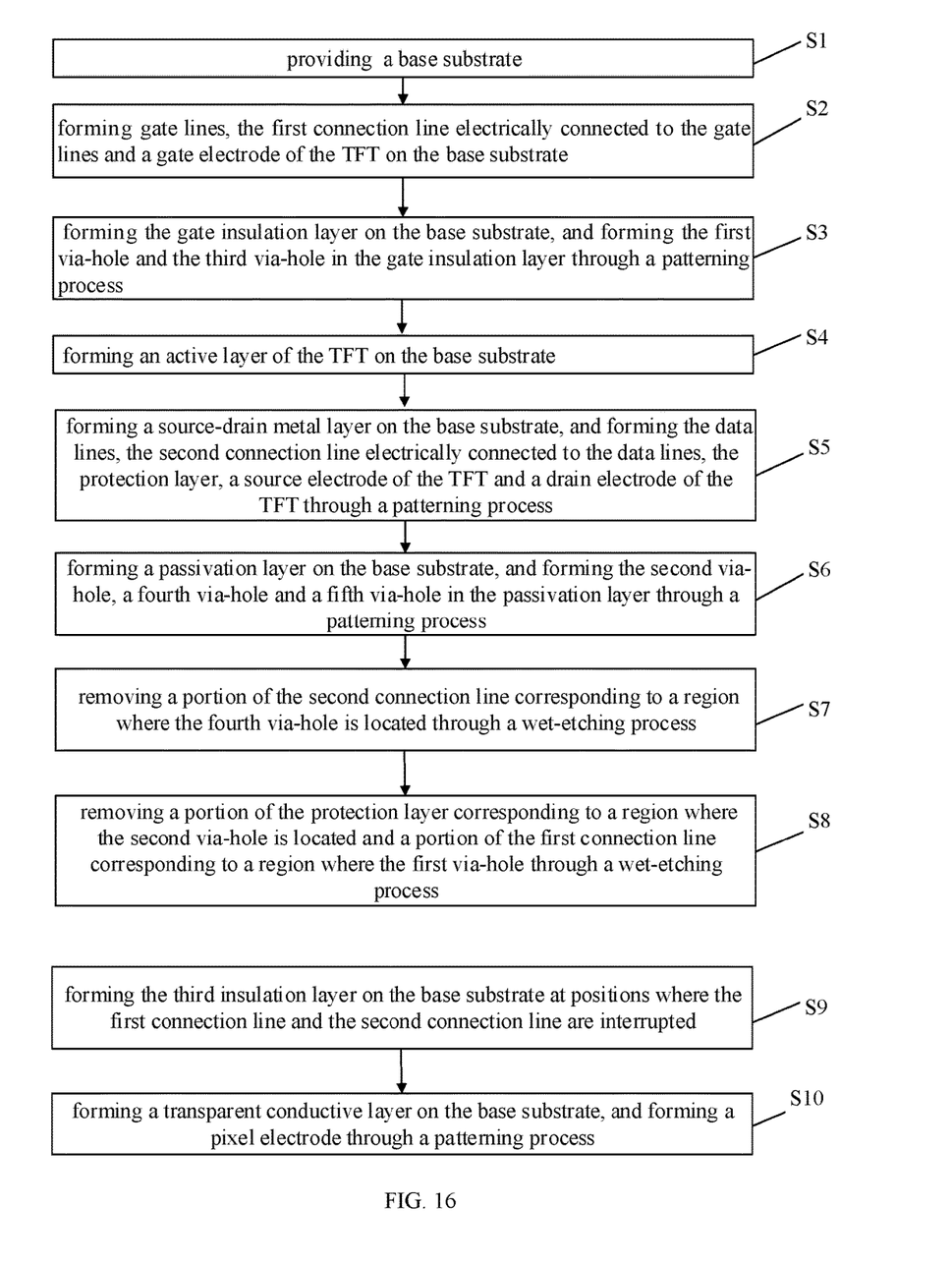
FIG. 16 is a flow chart of an example method according to the present disclosure.

Referring to FIG. 16, Step S1 is to provide a base substrate 100, as shown in FIG. 6 and FIG. 12. The base substrate 100 may be a transparent substrate, e.g., a glass substrate, a quartz substrate or an organic resin substrate.

Step S2 is to form the gate lines 10, the first connection line 20 electrically connected to the gate lines 10 and a gate electrode (not shown) of the TFT on the base substrate 100, as shown in FIG. 6 and FIG. 12.

To be specific, a gate metal layer 10A may be formed on the base substrate 100, and a photoresist may be applied onto the gate metal layer 10A. Then, the photoresist may be exposed and developed with a mask plate, so as to form a photoresist reserved region corresponding to regions where the gate lines 10, the first connection line 20 and the gate electrode are located, and a photoresist unreserved region corresponding to the other regions. Next, the gate metal layer at the photoresist unreserved region may be etched off through a wet-etching process, and the remaining photoresist at the photoresist reserved region may be removed, so as to form the gate lines 10, the first connection line 20 and the gate electrode of the TFT.

The gate metal layer 10A may be made of Cu, Al, Ag, Mo, Cr, Nd, Ni, Mn, Ti, Ta, W or an alloy thereof. The gate metal layer may be of a single-layered structure, or a multi-layered structure such as Cu/Mo, Ti/Cu/Ti or Mo/Al/Mo.

Step S3 is to form the gate insulation layer 101 on the base substrate 100 obtained after the Step S2, and form the first via-hole 1 and the third via-hole 3 in the gate insulation layer 101 through a patterning process, so as to expose portions of the first connection line 20 corresponding to the regions where the first via-hole 1 and the third via-hole 3 are located, as shown in FIGS. 6 and 12. The gate insulation layer 101 may be made of SiNx, SiOx or Si(ON)x, and it may be of a single-layered or multi-layered structure.

Step S4 is to form an active layer (not shown) of the TFT on the base substrate 100 obtained after the Step S3. The active layer may be made of a silicon semiconductor material or a metal oxide semiconductor material.

Step S5 is to form a source-drain metal layer 30A on the base substrate 100 obtained after the Step S4, and form the data lines 30, the second connection line 40 electrically connected to the data lines 30, the protection layer 21, a source electrode of the TFT and a drain electrode of the TFT through a patterning process. The source electrode and the drain electrode are lapped onto the active layer. A plurality of pixel regions is defined by the gate lines 10 and the data lines 30, and one TFT is provided at each pixel region. A portion of the first connection line 20 corresponding to a region where the first via-hole 1 is covered by the protection layer 21, and the second connection line 40 is electrically connected to the first connection line 20 through the third via-hole 3 in the gate insulation layer 101.

To be specific, a photoresist may be applied onto the source-drain metal layer 30A, and then exposed and developed, so as to form a photoresist reserved region corresponding to regions where the data lines 30, the second connection line 40, the protection layer 21, the source electrode and the drain electrode of the TFT are located, and a photoresist unreserved region corresponding to the other regions. Next, the source-drain metal layer at the photoresist unreserved region may be etched off, and the remaining photoresist at the photoresist reserved region may be removed, so as to form the data lines 30, the second connection line 40, the protection layer 21, the source electrode and the drain electrode of the TFT.

The source-drain metal layer 30A may be made of Cu, Al, Ag, Mo, Cr, Nd, Ni, Mn, Ti, Ta, W or an alloy thereof. The source-drain metal layer 30Amay be of a single-layered structure, or a multi-layered structure such as Cu/Mo, Ti/Cu/Ti or Mo/Al/Mo.

Step S6 is to form a passivation layer 102 on the base substrate 100 obtained after the Step S5, and form the second via-hole 2, a fourth via-hole 3A as shown in FIG. 23 and a fifth via-hole 4 in the passivation layer 102 through a patterning process. The second via-hole 2 is located at a position corresponding to the first via-hole 1 (as shown in FIGS. 6 and 7), i.e., at a position corresponding to a portion of the first connection line 20 to be interrupted, and it is used to interrupt the electrical connection among the gate lines 10. The fourth via-hole 3A is located at a position corresponding to the third via-hole 3, and it is used to interrupt the electrical connection between the first connection line 20 and the second connection line 40. The fifth via-hole 4 is located at a position corresponding to a portion of the second connection line 20 to be interrupted, and it is used to interrupt the electrical connection among the data lines 30, as shown I FIGS. 7 and 12.

To be specific, the first connection line 20 is connected to the gate lines 10 at their ends, and the first via-hole 1 and the second via-hole 2 are arranged between the adjacent gate lines 10. The second connection line 40 is connected to the data lines at their ends, and the fifth via-hole 4 is arranged between the adjacent data lines 30. The third via-hole 3 and the fourth via-hole 3A are located at a position corresponding to an intersection between the first connection line 20 and the second connection line 40.

The passivation layer 102 may be made of SiNx, SiOx or Si(ON)x, and it may be of a single-layered or multi-layered structure.

Step S7 is to remove a portion of the second connection line 40 corresponding to a region where the fourth via-hole 3A is located (at a position corresponding to the third via-hole 3) through a wet-etching process, so as to interrupt the electrical connection between the first connection line 20 and the second connection line 40.

Step S8 is to remove a portion of the protection layer 21 corresponding to a region where the second via-hole 2 is located and a portion of the first connection line 20 corresponding to a region where the first via-hole 1 through a wet-etching process, so as to interrupt the first connection line 20, thereby to interrupt the electrical connection among the gate lines 20; and remove a portion of the second connection line 40 corresponding to a region where the fifth via-hole 4 is located through the wet-etching process, so as to interrupt the second connection line 40, thereby to interrupt the electrical connection among the data lines 30.

Step S9 is to form the third insulation layer 103 on the base substrate 100 obtained after the Step S8 at positions where the first connection line 20 and the second connection line 40 are interrupted. The third insulation layer 103 may be made of SiNx, SiOx or Si(ON)x, and it may be of a single-layered or multi-layered structure.

Step S10 is to form a transparent conductive layer (which may be made of indium zinc oxide or indium tin oxide) on the base substrate 100 obtained after the Step S9, and form a pixel electrode through a patterning process. The pixel electrode is located at the pixel region, and it is electrically connected to the drain electrode of the TFT through a sixth via-hole (not shown) in the passivation layer 102.

The bottom-gate TFT array substrate may be obtained through the above-mentioned steps.

In the case that the two via-holes are arranged at positions corresponding to each other (e.g., the first via-hole is arranged at a position corresponding to the second via-hole), it means that projections of the two via-holes onto the base substrate 100 at least partially, e.g., completely, overlap each other.

The electrical connection among the signal lines have been interrupted after the manufacture of the array substrate, and at this time, it is able to test the array substrate. In the case that there are abnormalities for the signal lines, e.g., the signal line is short-circuited or broken, measures may be taken so as to improve the yield.

The present disclosure further provides in some embodiments an array substrate manufactured by the above-mentioned method. According to the embodiments of the present disclosure, it is able to ensure the performance of the array substrate and improve the yield.

The present disclosure further provides in some embodiments a display device including the above-mentioned array substrate. According to the embodiments of the present disclosure, it is able to improve the yield and the display quality.

The display device may be a liquid crystal display device, an organic light-emitting diode (OLED) display device, or any other display device. To be specific, the display device may be any product or component having a display function, such as a liquid crystal panel, an electronic paper, an OLED panel, a mobile phone, a flat-panel computer, a television, a display, a laptop computer, a digital photo frame or a navigator.

According to the embodiments of the present disclosure, during the manufacture of the array substrate, the connection line is provided to connect the signal lines, so as to increase a resistance-capacitance value, thereby to improve the absorption capability to the electrostatic electricity. Since it merely needs to provide one layer of connection line to achieve the electrostatic protection, thus the electrostatic protection can be provided for the array substrate in most of the time during the manufacture process. The connection line is covered by at least two insulation layers, and the via-holes for interrupting the connection line are formed in the insulation layers at positions corresponding to each other, so as to prevent the insulation layers from being dry-etched for a long period of time, thereby to remarkably reduce the electrostatic electricity generated during the formation of the via-holes. In addition, the protection layer is provided to cover the portion of the connection line corresponding to the region where the via-hole is located, so as to prevent the connection line from being interrupted during the manufacture of the array substrate. Upon the completion of the insulation layers, the connection line may be interrupted through the via-holes, so as to interrupt the electrical connection among the signal lines.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for manufacturing an array substrate, comprising steps of:
    forming a plurality of signal lines;
    forming a connection line electrically connected to the plurality of signal lines;
    forming a first insulation layer on the plurality of signal lines and forming a first via-hole in the first insulation layer through a patterning process;
    after formation of the first insulation layer on the plurality of signal lines and formation of the first via-hole in the first insulation layer, forming a protection layer covering a portion of the connection line corresponding to a region where the first via-hole is located; and
    after formation of the protection layer, forming at least one second insulation layer on the first insulation layer with a second via-hole formed through a patterning process in each second insulation layer at a position corresponding to the first via-hole;
    wherein after the step of forming the at least one second insulation layer, the method further comprises:
    removing a portion of the protection layer corresponding to the region where the first via-hole is located; and
    interrupting the connection line at a position corresponding to the first via-hole, so as to interrupt electrical connection of the plurality of signal lines.

2. The method according to claim 1, wherein before the step of forming the at least one second insulation layer, the method further comprises: forming a pattern of a first conductive layer;
    wherein the first conductive layer forms the protection layer.

3. The method according to claim 2, wherein the pattern of the first conductive layer is formed before the formation of each second insulation layer, and at least one of the first conductive layers forms the protection layer.

4. The method according to claim 1, wherein the array substrate comprises at least two kinds of signal lines for transmitting different signals, and connection lines corresponding to the at least two kinds of signal lines, respectively;
wherein the connection lines corresponding to the at least two kinds of signal lines are electrically connected to each other.

5. The method according to claim 2, wherein after the step of interrupting the connection line at the position corresponding to the first via-hole, the method further comprises: forming a third insulation layer at a position where the connection line is interrupted.

6. The method according to claim 2, wherein the array substrate is a bottom-gate thin film transistor array substrate, the signal lines comprise a plurality of gate lines and a plurality of data lines, and the connection line comprises a first connection line electrically connected to the gate lines and a second connection line electrically connected to the data lines,
the method further comprises steps of:
forming a gate metal layer, and forming the plurality of gate lines and the first connection line electrically connected to the gate lines through a patterning process;
forming a gate insulation layer on the plurality of gate lines, and forming the first via-hole and a third via-hole in the gate insulation layer through a patterning process, so as to expose the first connection line at regions where the first via-hole and the third via-hole are located;
forming a source-drain metal layer on the gate insulation layer, and forming the plurality of data lines, the second connection line electrically connected to the data lines, and the protection layer through a patterning process, a portion of the first connection line corresponding to the region where the first via-hole is located being covered by the protection layer, the second connection line being electrically connected to the first connection line through the third via-hole;
forming a passivation layer on the source-drain metal layer, and forming the second via-hole, a fourth via-hole and a fifth via-hole in the passivation layer through a patterning process, the second via-hole being located at a position corresponding to the first via-hole, the fourth via-hole being located at a position corresponding to the third via-hole;
removing a portion of the second connection line corresponding to a region where the fourth via-hole is located through a wet-etching process, so as to interrupt electrical connection between the second connection line and the first connection line;
removing the protection layer and a portion of the first connection line corresponding to a region where the first via-hole is located through a wet-etching process, so as to interrupt the first connection line, thereby to interrupt electrical connection among the gate lines; and
removing a portion of the second connection line corresponding to a region where the fifth via-hole is located through a wet-etching process, so as to interrupt the second connection line, thereby to interrupt electrical connection among the data lines.

7. The method according to claim 6, wherein the step of forming the plurality of data lines, the second connection line electrically connected to the data lines, and the protection layer through the patterning process comprises:
applying a photoresist onto the source-drain metal layer, and exposing and developing the photoresist to form a photoresist reserved region at least corresponding to regions where the data lines, the second connection lines and the protection layer are located, and a photoresist unreserved region corresponding to the other regions;
etching off the source-drain metal layers at the photoresist unreserved region; and
removing the photoresist at the photoresist reserved region, so as to form the data lines, the second connection line and the protection layer.

8. A method for manufacturing an array substrate, comprising steps of:
forming a plurality of signal lines;
forming a connection line electrically connected to the plurality of signal lines;
forming a first insulation layer on the plurality of signal lines and forming a first via-hole in the first insulation layer through a patterning process;
forming a protection layer covering a portion of the connection line corresponding to a region where the first via-hole is located; and
forming at least one second insulation layer on the first insulation layer with a second via-hole formed through a patterning process in each second insulation layer at a position corresponding to the first via-hole;
wherein after the step of forming the at least one second insulation layer, the method further comprises:
removing a portion of the protection layer corresponding to the region where the first via-hole is located; and
interrupting the connection line at a position corresponding to the first via-hole, so as to interrupt electrical connection of the plurality of signal lines;
wherein before the step of forming the at least one second insulation layer, the method further comprises: forming a pattern of a first conductive layer; wherein the first conductive layer forms the protection layer;
wherein the array substrate is a bottom-gate thin film transistor array substrate, the signal lines comprise a plurality of gate lines and a plurality of data lines, and the connection line comprises a first connection line electrically connected to the gate lines and a second connection line electrically connected to the data lines,
the method further comprises steps of:
forming a gate metal layer, and forming the plurality of gate lines and the first connection line electrically connected to the gate lines through a patterning process;
forming a gate insulation layer on the plurality of gate lines, and forming the first via-hole and a third via-hole in the gate insulation layer through a patterning process, so as to expose the first connection line at regions where the first via-hole and the third via-hole are located;
forming a source-drain metal layer on the gate insulation layer, and forming the plurality of data lines, the second connection line electrically connected to the data lines, and the protection layer through a patterning process, a portion of the first connection line corresponding to the region where the first via-hole is located being covered by the protection layer, the second connection line being electrically connected to the first connection line through the third via-hole;
forming a passivation layer on the source-drain metal layer, and forming the second via-hole, a fourth via-hole and a fifth via-hole in the passivation layer through a patterning process, the second via-hole being located at a position corresponding to the first via-hole, the fourth via-hole being located at a position corresponding to the third via-hole;

removing a portion of the second connection line corresponding to a region where the fourth via-hole is located through a wet-etching process, so as to interrupt electrical connection between the second connection line and the first connection line;

removing the protection layer and a portion of the first connection line corresponding to a region where the first via-hole is located through a wet-etching process, so as to interrupt the first connection line, thereby to interrupt electrical connection among the gate lines; and removing a portion of the second connection line corresponding to a region where the fifth via-hole is located through a wet-etching process, so as to interrupt the second connection line, thereby to interrupt electrical connection among the data lines.

9. The method according to claim 8, wherein the step of forming the plurality of data lines, the second connection line electrically connected to the data lines, and the protection layer through the patterning process comprises:

applying a photoresist onto the source-drain metal layer, and exposing and developing the photoresist to form a photoresist reserved region at least corresponding to regions where the data lines, the second connection lines and the protection layer are located, and a photoresist unreserved region corresponding to the other regions;

etching off the source-drain metal layers at the photoresist unreserved region; and removing the photoresist at the photoresist reserved region, so as to form the data lines, the second connection line and the protection layer.

* * * * *